United States Patent
Chopra et al.

(10) Patent No.: US 6,602,117 B1
(45) Date of Patent: Aug. 5, 2003

(54) SLURRY FOR USE WITH FIXED-ABRASIVE POLISHING PADS IN POLISHING SEMICONDUCTOR DEVICE CONDUCTIVE STRUCTURES THAT INCLUDE COPPER AND TUNGSTEN AND POLISHING METHODS

(75) Inventors: Dinesh Chopra, Boise, ID (US); Nishant Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 6 days.

(21) Appl. No.: 09/651,808

(22) Filed: Aug. 30, 2000

(51) Int. Cl.[7] .............................. B24B 1/00; C09K 3/14; C09G 1/02; C09G 1/04
(52) U.S. Cl. ............................ 451/65; 51/307; 51/308; 51/309; 106/3; 252/79.1; 438/692; 438/693
(58) Field of Search .......................... 51/307, 308, 309, 51/293; 216/88, 89; 438/692, 693; 451/36, 41, 54, 59, 60, 63, 64, 65, 285, 286, 287, 288, 289, 290, 446; 106/3; 252/79.1

(56) References Cited

U.S. PATENT DOCUMENTS

| | | | |
|---|---|---|---|
| 5,780,358 A | | 7/1998 | Zhou et al. |
| 5,836,806 A | | 11/1998 | Cadien et al. |
| 5,840,629 A | | 11/1998 | Carpio |
| 5,846,398 A | | 12/1998 | Carpio |
| 5,863,307 A | | 1/1999 | Zhou et al. |
| 5,897,375 A | | 4/1999 | Watts et al. |
| 5,954,975 A | | 9/1999 | Cadien et al. |
| 5,954,997 A | | 9/1999 | Kaufman et al. |
| 5,985,748 A | | 11/1999 | Watts et al. |
| 6,001,730 A | | 12/1999 | Farkas et al. |
| 6,046,099 A | | 4/2000 | Cadien et al. |
| 6,063,306 A | | 5/2000 | Kaufman et al. |
| 6,083,419 A | * | 7/2000 | Grumbine et al. ............ 216/88 |
| 6,083,840 A | | 7/2000 | Mravic et al. |
| 6,100,197 A | | 8/2000 | Hasegawa |
| 6,375,693 B1 | * | 4/2002 | Cote et al. ..................... 51/308 |
| 6,409,781 B1 | * | 6/2002 | Wojtczak et al. ............. 51/308 |
| 2002/0022370 A1 | * | 2/2002 | Sun et al. ..................... 438/691 |
| 2002/0033382 A1 | * | 3/2002 | Kaufman et al. .............. 216/89 |

FOREIGN PATENT DOCUMENTS

| | | |
|---|---|---|
| WO | WO 98/49723 | 11/1998 |
| WO | WO 00/00561 | 1/2000 |
| WO | WO 00/28586 | 5/2000 |
| WO | WO 01/21724 A1 | 3/2001 |

OTHER PUBLICATIONS

Lee, Michael G., et al., "Planarization of Copper/Polyimide for Multilevel Interconnects by Chemical Mechanical Polishing (CMP)," VMIC (1996), pp. 395–397, Proceedings of 13th Internat'l. VLSI Multilevel Interconnection Conf., Santa Clara, CA, Jun. 18–20, 1996.

Stavreva, Z., et al., "Chemical—Mechanical Polishing of Copper for Interconnect Formation," Microelectronic Eng.,, vol. 33 (1997), pp. 249–257.

Seung–Mahn Lee, et al., "Study of Slurry Chemistry in Chemical Mechanical Polishing (CMP) of Copper," Database Chemabs Online!, Chemical Abstracts, Columbus, Ohio, Proceedings—electrochmical Society (2000)..

Seung–Mahn Lee, et al., "Fundamental Study of Iodate and Iodine Based Slurries for Copper CMP," Mat. Res. Soc. Symp., vol. 613, ©2000 Materials Research Society, pp. E7.8.1–E7.8.6.

PCT International Search Report of Jul. 30, 2002.

* cited by examiner

Primary Examiner—Timothy V. Eley
(74) Attorney, Agent, or Firm—TraskBritt

(57) ABSTRACT

A method for substantially simultaneously polishing a copper conductive structure of a semiconductor device structure and an adjacent barrier layer. The method includes use of a fixed-abrasive type polishing pad with a substantially abrasive-free slurry in which copper is removed at a rate that is substantially the same as or faster than a rate at which a material, such as tungsten, of the barrier layer is removed. The slurry is formulated so as to oxidize copper at substantially the same rate as or at a faster rate than a material of the barrier layer is oxidized. Thus, copper and the barrier layer material have substantially the same oxidation energies in the slurry or the oxidation energy of the barrier layer material in the slurry may be greater than that of copper. Systems for substantially polishing copper conductive structures and adjacent barrier structures on semiconductor device structures are also disclosed.

76 Claims, 4 Drawing Sheets

SLURRY FOR USE WITH FIXED-ABRASIVE POLISHING PADS IN POLISHING SEMICONDUCTOR DEVICE CONDUCTIVE STRUCTURES THAT INCLUDE COPPER AND TUNGSTEN AND POLISHING METHODS

BACKGROUND OF THE INVENTION

1. Field of the Invention

The present invention relates generally to slurries that are useful in chemical-mechanical polishing or chemical-mechanical planarization processes and, more specifically, to slurries that are used to polish or planarize electrically conductive structures of semiconductor devices that include copper and an adjacent tungsten barrier. The present invention also relates to methods for substantially concurrently polishing or planarizing structures formed from copper and tungsten.

2. Background of Related Art

CMP

Chemical-mechanical polishing and chemical-mechanical planarization, both of which are referred to in the art as "CMP", are abrasive techniques that typically include the use of a combination of chemical and mechanical agents to planarize, or otherwise remove material from a surface of a semiconductor material substrate during the fabrication of devices thereon. A chemical component, typically a slurry that includes one or more oxidizers, abrasives, complexing agents, and inhibitors, oxidizes the surface of one or more material layers that are being polished or planarized (i.e., at least partially removed). A polishing pad formed from a material such as polyurethane or acrylic is used with the slurry and, in combination with abrasives present in the slurry, effects mechanical removal of the layer or layers from the surface of the semiconductor device structure. It should be noted that abrasive-only polishing and planarization, e.g., without the use of active chemical agents to effect material removal, are becoming more prevalent due to environmental concerns. Thus, the term "CMP" as used herein encompasses such abrasive-only (i.e., strictly mechanical) methods and apparatus.

Conventional CMP pads are round, planar, and have larger dimensions than the semiconductor substrates (e.g., wafers or other substrates including silicon, gallium arsenide, indium phosphide, etc.) upon which the structures or layers to be planarized or otherwise polished have been formed. In polishing one or more layers or structures formed on a substrates the substrate and the conventional CMP pad are rotated relative to one another, with the location of the substrate being moved continuously relative to the polishing surface of the pad so that different areas of the pad are used to polish one or more of the layers or structures formed on the substrate.

Another polishing format is the so-called "web" format, wherein the pad has an elongated, planar configuration. The web is moved laterally from a supply reel to a take-up reel so as to provide "fresh" areas thereof for polishing one or more layers or structures formed on a semiconductor substrate. A similar, newer polishing format is the so-called "belt" format, wherein the pad is configured as a belt, or continuous loop, of polishing material. In both the "web" and "belt" formats, the semiconductor substrate is rotated or revolved upon being brought into contact with the pad. The pad is moved when a "fresh" polishing surface is needed or desired.

A new type of polishing pad, known in the art as a fixed-abrasive pad, may be used to polish or planarize layers formed on a semiconductor substrate. Fixed-abrasive pads, which may be embodied in the conventional, web, or belt formats, are typically formed from an acrylic material and embedded with particles of abrasive materials. The pad and embedded abrasives effect the mechanical part of CMP processes. During use of the fixed-abrasive pad to planarize or polish one or more layers on the surface of a semiconductor device during fabrication thereof, the abrasive material is exposed at a polishing surface of the pad. Some of the abrasive material may also be leached out of the pad. As a result of the inclusion of abrasive particles in the pad, the chemical slurries that are used to effect the chemical portion of chemical-mechanical polishing or chemical-mechanical planarization need not include the abrasives that are often required when conventional, abrasive-free pads are employed.

Copper Conductive Structures

The use of copper as a conductive material in semiconductor devices is also ever-increasing. When copper is used in semiconductor devices, however, a barrier layer is typically required between the copper and adjacent structures or layers. The barrier layer prevents diffusion of the copper into the adjacent layers or structures, as well as the formation of copper silicides, both of which may cause electrical shorts in semiconductor devices that include copper. Tantalum is an example of a material that is useful as a copper barrier. When tantalum is used, the semiconductor device, including any features thereof into which copper is to be disposed (e.g., trenches), is lined with a layer of tantalum. The tantalum layer is then typically covered with a thin copper layer, often formed by physical vapor deposition ("PVD") processes. The thin copper layer then acts as a so-called "seed layer" for the formation of a copper structure, such as a conductive line, such as by electroplating processes.

Once the tantalum and copper layers have been formed, it is necessary to isolate separate tantalum-copper conductive structures from one another. CMP processes are typically used to remove the tantalum and copper between the structures from over the active surface of the semiconductor device being fabricated. Slurries that are used in copper CMP processes typically have a pH of about 7.0. Many of these slurries include hydrogen peroxide ($H_2O_2$) as an oxidizing agent. Since hydrogen peroxide readily generates hydroxy free radicals (OH.), hydrogen peroxide is a very strong oxidizing agent. Tantalum, however, is substantially chemically inert. Thus, the oxidizers of CMP slurries that remove copper do not effectively oxidize tantalum and, thus, do not adequately effect the removal of tantalum. Likewise, slurries that are useful for removing tantalum by CMP processes are likewise not effective for removing copper. As a result, when conventional CMP processes are used to isolate the tantalum-copper conductive structures of a semiconductor device, two separate slurries must be used.

It has been proposed that tungsten be used in place of tantalum in semiconductor devices as a barrier material for copper conductive structures. Nonetheless, when known copper CMP slurries are used to substantially simultaneously CMP tungsten and copper, the tungsten barrier layer may dissolve, or be removed, at a faster rate than the copper. This is at least partially because, as the following chemical equations illustrate, tungsten (W) is more readily oxidized than copper (Cu):

$$W + 2H_2O \rightarrow 4H^+ + 4e^- + WO_2 \quad E_0 = 0.12;$$

$$Cu \rightarrow (Cu)^{2+} + 2e^- \quad E_0 = -0.34.$$

Thus, in conventional slurries, although both copper and tungsten are simultaneously exposed to the same oxidants, the tungsten will typically be oxidized first. As a result, gaps may form in locations where the barrier material should be located between copper conductive structures and adjacent portions of the semiconductor device structure upon which the conductive structures are being fabricated.

This phenomenon is illustrated in the electron micrograph of FIG. 1, which illustrates a semiconductor device structure 10 that includes the portions of a copper layer 20 and an underlying tungsten barrier layer 18 disposed within a recess 14 formed in an active surface 16 of a substrate 12 of semiconductor device structure 10 following CMP thereof using an alumina fixed-abrasive polishing pad and a copper CMP slurry having a pH of about 7. Once an interface 19 between barrier layer 18 and copper layer 20 was exposed during the CMP process, tungsten of barrier layer 18 was oxidized and dissolved at a faster rate than the adjacent copper of copper layer 20, leaving a gap 21 between copper layer 20 and adjacent regions of substrate 12, as well as undesirably permitting copper of copper layer 20 to contact and, possibly, diffuse into unprotected adjacent regions of substrate 12.

The inventors are not aware of a slurry that is useful in CMP processes and that effectively polishes or planarizes both copper and tungsten without causing oxidation or dissolution of the tungsten.

BRIEF SUMMARY OF THE INVENTION

The present invention includes a method for substantially simultaneously chemical-mechanical polishing a copper conductive structure and an adjacent barrier layer with a fixed-abrasive type polishing pad, as well as slurries that are useful with fixed-abrasive type polishing pads for substantially simultaneously polishing a copper conductive structure and a barrier layer adjacent thereto.

The method of the present invention includes employing a fixed-abrasive type polishing pad along with a substantially abrasive-free liquid polishing formulation, which is referred to herein as a substantially abrasive-free slurry or, more simply, as a slurry. The slurry is formulated to oxidize copper and a material of the barrier layer, such as tungsten, at substantially the same rates. Thus, in a slurry incorporating teachings of the present invention, the oxidation energies of copper and the barrier material are substantially the same. Preferably, in the slurry, the oxidation energy, or oxidation potential, of a barrier material, such as tungsten, is about 0.25 V greater to about 0.20 V less than an oxidation energy, or oxidation potential, of copper. As the barrier material is oxidized by the slurry at about the same rate as copper or at a slower rate than copper, use of a slurry so formulated to substantially simultaneously polish a copper conductive structure and an adjacent barrier layer prevents dissolution of the barrier layer. When used with a fixed-abrasive polishing pad, the slurry of the present invention removes a barrier material, such as tungsten, at a rate that is about the same as or up to about ten times slower than the rate at which the slurry removes copper and, preferably, at a rate that is about two to about four times slower than the rate at which the slurry removes copper.

Slurries that are useful in the method of the present invention include at least one oxidizer, at least one complexing agent, and at least one inhibitor. The relative amounts of at least the oxidizer, the pH control agent, and the inhibitor are balanced so as to facilitate substantially concurrent polishing of a copper structure and another structure adjacent thereto, such as a barrier layer formed from tungsten. Thus, the slurry is formulated such that the relative amounts of the oxidizer, the complexing agent, and the inhibitor oxidize copper and a barrier material, such as tungsten, at substantially the same rates, or such that the oxidation energies of copper and the barrier material are substantially the same in the slurry. The pH of the slurry may also be optimized so as to provide for oxidation of copper and a barrier material, such as tungsten, at substantially the same rates.

The present invention also includes a system for substantially simultaneously polishing a copper conductive structure and an adjacent barrier layer of a semiconductor device. Such a system includes a fixed-abrasive type polishing pad and a substantially abrasive-free slurry within which copper and the material of the barrier layer are oxidized at substantially the same rates, or have substantially the same oxidation energies.

Other features and advantages of the present invention will become apparent to those of ordinary skill in the art through consideration of the ensuing description, the accompanying drawings, and the appended claims.

DETAILED DESCRIPTION OF THE INVENTION

Figure 2:
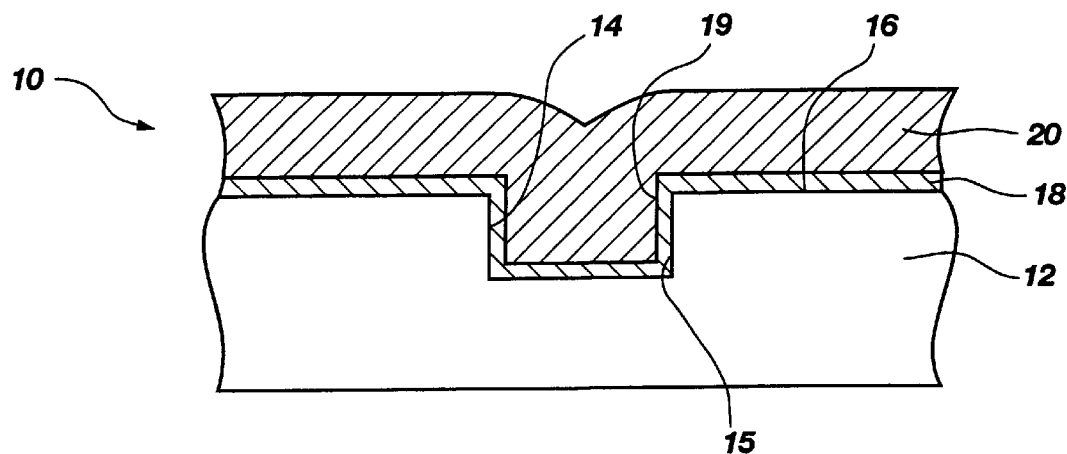
FIGS. 2–5 schematically illustrate an exemplary embodiment of a polishing method in which copper and a barrier material therefor are substantially simultaneously removed from a semiconductor device structure at substantially the sane rates.

A method incorporating teachings of the present invention is illustrated in FIGS. 2–5. With reference to FIG. 2, a semiconductor device structure 10 including a substrate 12, which includes a recess 14 formed in an active surface 16 thereof is shown. A barrier layer 18 of a material, such as tungsten, that prevents copper from diffusing into adjacent insulative regions of semiconductor device structure 10 is located on active surface 16 and on the surfaces 15 of recess 14. A copper layer 20 is formed over and contacts barrier layer 18. Copper layer 20 also substantially fills recess 14. Although substrate 12 may include various other structures beneath recess 14, barrier layer 18, and copper layer 20, for purposes of simplicity, no additional structures are illustrated in the semiconductor device structure 10 shown in FIGS. 2–5.

Figure 3:
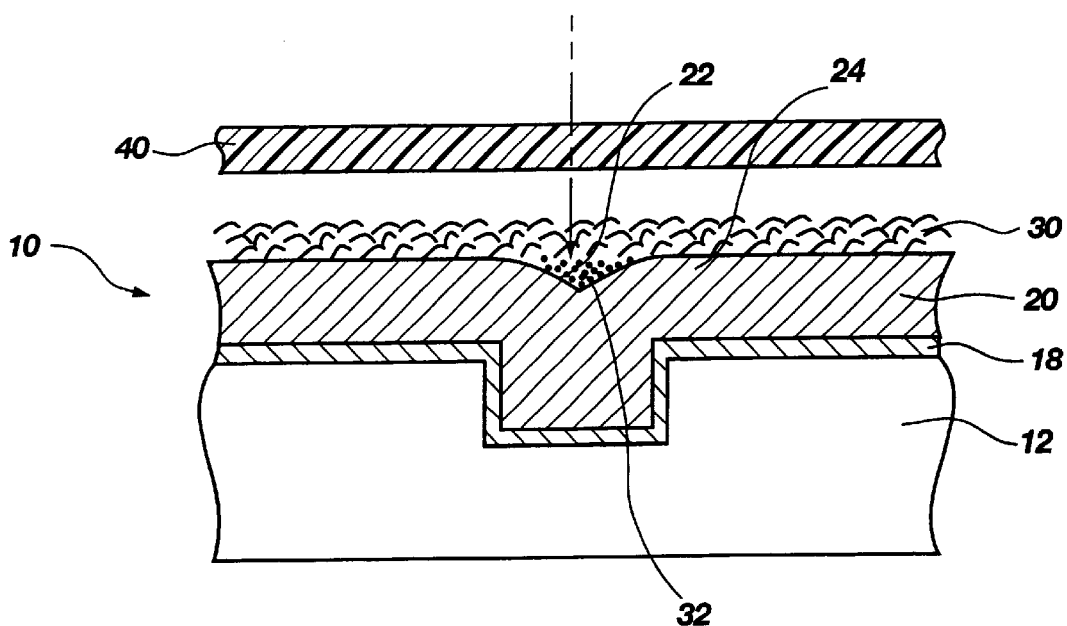

In forming a conductive structure from copper layer 20, portions of copper layer 20 and of barrier layer 18 that are not located within recess 14 must be removed from semiconductor device structure 10. As discussed previously herein, CMP processes are typically used to remove unwanted portions of copper layers. With reference to FIG. 3, a slurry 30 is applied over copper layer 20. A fixed-abrasive polishing pad 40, which may be embodied as a conventional polishing pad, a web-type polishing pad, a belt-type polishing pad, or in any other polishing pad format known in the art, is then brought into frictional contact (e.g., by rotation of semiconductor device structure 10 or polishing pad 40) with copper layer 20 to, along with slurry 30, remove copper layer 20. An inhibitor component 32 of slurry 30 fills recessed areas 22 of copper layer 20, thereby preventing removal of material from recessed areas 22 until material of higher areas 24 of copper layer 20 has been removed.

Figure 4:
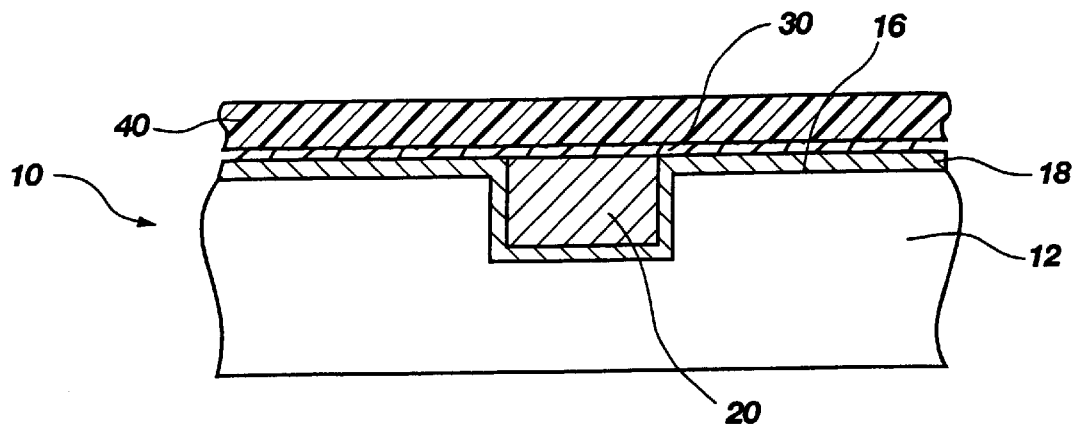

Eventually, regions of barrier layer 18 overlying active surface 16 are exposed through copper layer 20, as shown in FIG. 4. At this point, slurry 30 and fixed-abrasive polishing pad 40 remove the material or materials of barrier layer 18 and the copper of copper layer 20 at substantially the same rates.

Figure 5:
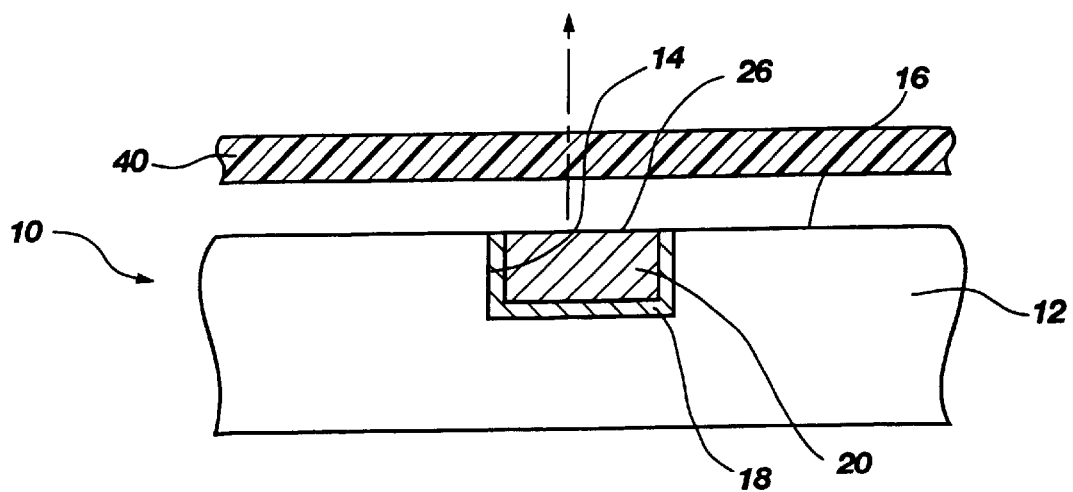

Barrier layer 18 is removed from active surface 16 by continued polishing with slurry 30 and fixed-abrasive polishing pad 40. Once barrier layer 18 is substantially removed from active surface 16 and the surface 26 of the portion of copper layer 20 that remains within recess 14 is located substantially in the plane of active surface 16, as depicted in FIG. 5, the polishing process is terminated. As illustrated in FIG. 5, the remaining portion of barrier layer 18 substantially lines recess 14 and separates the remaining portion of copper layer 20 from adjacent portions of substrate 12.

In order to effect removal of copper and the material or materials (e.g., tungsten) of an adjacent barrier layer 18 or other structure by CMP at substantially the same rates, slurry 30 is formulated so as to oxidize copper and the material or materials of the adjacent barrier layer 18 at substantially the same rates. Stated another way, copper and the material or materials (e.g., tungsten) of the adjacent barrier layer 18 have substantially the same oxidation energies, in slurry 30. As a result, as an interface 19 between layers 18 and 20 is exposed to slurry 30, the material or materials of barrier layer 18 will not dissolve, or be removed from semiconductor device structure 10, at a significantly greater rate than copper of copper layer 20 is dissolved or removed from semiconductor device structure 10. By way of example only, and not to limit the scope of the present invention the oxidation energy, or oxidation potential, of tungsten in slurry 30 is preferably about 0.25 V more to about 0.20 V less than the oxidation energy, or oxidation potential, of copper in slurry 30. Slurry 30 preferably removes a barrier material, such as tungsten, at a rate that is about the same as or up to about ten times slower than the rate at which slurry 30 removes copper when a fixed-abrasive polishing pad is employed and, more preferably, at a rate that is about two to about four times slower than the rate at which slurry 30 removes copper.

With continued reference to FIGS. 2–5, slurry 30 is intended to be used in conjunction with a fixed-abrasive polishing pad 40, such as the acrylic fixed-abrasive polishing pads manufactured by 3M Company of St. Paul, Minnesota. Such a fixed-abrasive polishing pad 40 may be impregnated with particulate abrasives including, but not limited to, alumina ($Al_2O_3$), titanium dioxide ($TiO_2$), silicon dioxide ($SiO_2$), and cerium dioxide ($CeO_2$). The abrasives in a fixed-abrasive polishing pad 40 are typically leached therefrom during polishing of a semiconductor device structure 10. Thus, slurry 30 need not include abrasives and is preferably substantially free of abrasives. Slurry 30 includes an inhibitor component 32, which prevents recessed, or lower, areas 22 of copper layer 20 from being removed until higher areas 24 of copper layer 20 have been removed down to substantially the same plane. Slurry 30 also includes an oxidizer component, which oxidizes both the copper of copper layer 20 and the material or materials (e.g., tungsten) of barrier layer 18 so as to chemically soften these materials and to thereby facilitate their mechanical removal from semiconductor device structure 10 by fixed-abrasive polishing pad 40. In addition, slurry 30 includes one or more complexing agents, which complex with ions of the layers 18, 20 being removed (e.g., copper ions from copper layer 20) so as to facilitate the dissolution of these reactant ions, allowing these reactant ions to be moved away from the locations at which layers 18 and 20 are being oxidized. As a result, the continued oxidation of material layers 18, 20 by slurry 30 may occur at optimal rates and, thus, the rates at which the materials of layers 18 and 20 are removed from semiconductor device structure 10 may also be optimized.

Examples of oxidizers that are useful as the oxidizer component of slurry 30 include, without limitation, hydrogen peroxide, potassium iodate, potassium permanganate, ammonia, other amine compounds, ammonium compounds, nitrate compounds, and combinations thereof. Exemplary ammonium compounds include, without limitation, ammonium persulfate and ammonium molybdate. Exemplary nitrate compounds include, but are not limited to, ferric nitrate, nitric acid, and potassium nitrate. The oxidizer component preferably comprises about 0.1 to about 20%, by weight, of slurry 30. It is preferred that slurry 30 include about 0.1 to about 5.0%, by weight, of the oxidizer component. Even more preferred is a potassium iodate oxidizer component that makes up about 3 to about 5% of the weight of slurry 30.

The one or more complexing agents of slurry 30 may include, but are not limited to, glycine, ammonium citrate, ammonium phosphate, ammonium acetate, and combinations thereof. Slurry 30 preferably includes about 1 to about 15% of the one or more complexing agents, by weight. It is more preferred that the one or more complexing agents make up about 3 to about 5% of the weight of slurry 30. For example, slurry 30 may include about 1% of the complexing agent glycine, including a concentration of 0.1 M (molar) polyethylene glycol (PEG), by weight of slurry 30. As another example, slurry 30 may include about 3% ammonium acetate, by weight.

Inhibitor component 32 of slurry 30 prevents corrosion of copper during polishing. Inhibitor component may include an azole, such as benzenetriazole (BTA), mercaptobenzothiazole, and tolytriazole, an amine, such as methylamine and diethylamine, a ring compound, such as pyridine, quinoline, and dicyclohexamine nitrate, as well as other compounds, such as potassium silicate, ammonium borate, ammonium phosphate, and potassium dichromate, or mixtures of any of these corrosion inhibitors. While inhibitor component 32 may make up about 0.05 to about 2% of the weight of slurry 30, it is preferred the inhibitor component 32 comprise about 0.05 to about 0.2% of the weight of slurry 30. For example, slurry 30 may include about 0.1% BTA, by weight.

Slurry 30 may have a pH in the range of about 2 to about 6, but the pH of slurry 30 is preferably in the range of about 3 to about 5 and, more preferably, is about 4. One or more buffers, which are also referred to herein as pH control agents, may be used, as known in the art, to adjust the pH of slurry 30 to a desired level. Exemplary buffers that may be used in slurry 30 include, without limitation, potassium hydrogen phthalate, ammonium acetate, ammonium oxalate, ammonium carbamate, ammonium phosphate, ammonium hydrogen phosphate, ammonium dihydrogen phosphate, dibasic ammonium citrate, tribasic ammonium citrate, and mixtures thereof. Acetic acid, phosphoric acid, and sulfuric acid; are examples of other pH control agents that may be used in a slurry 30 incorporating teachings of the present invention. Preferably, the pH control agent will adjust the pH of slurry 30 to a desirable range or point without significantly etching the insulator (e.g., borophosphosilicate glass (BPSG), phosphosilicate glass (PSG), or borosilicate glass (BSG)) that underlies the layer or layers being polished. Without limitation, acetic acid is an example of a buffer that may be used to adjust the pH of slurry 30 and that will not etch an underlying glass insulator.

In addition, slurry 30 may include a surfactant component, which may comprise from about 1% to about 15% of the volume of slurry 30 and, more preferably, about 1% to about 2% of the weight of slurry 30. The surfactant component may include, for example, polyethylene glycol, polyoxyethylene ether, glycerol, polypropylene glycol, polyoxyethylene lauryl ether, polyoxyethylene cetyl ether, polyoxyethylene stearyl ether, polyoxyethylene oleyl ether, and mixtures thereof Thickeners may also be included in slurry 30 to impart slurry 30 with a desired viscosity (e.g., about 10 to about 20 cps. at ambient temperature). Exemplary thickeners that may be included in slurry 30 include, but are not limited to, POLYOX®, available from Union Carbide of Danbury, Conn., and CARBOPOL®, available from B.F. Goodrich of Cleveland, Ohio.

Water may be used as the balance of slurry 30.

The specific amounts of the components of slurry 30 may be determined by identifying slurry 30 formulations in which copper gives up electrons at substantially the same rate as a barrier material, such as tungsten, of a barrier layer 18 to be polished substantially simultaneously with copper layer 20. Stated another way, slurry 30 may be formulated so that copper and a barrier material therefor, such as tungsten, have the substantially same oxidation energies therein, or are oxidized at substantially the same rates therein. Preferably, the oxidation energy of tungsten or another barrier material in slurry 30 is within the range of about 0.25 V more than to about 0.20 V less than the oxidation energy of copper in slurry 30, the range including the end point values thereof. These formulations of slurry 30 will facilitate the removal of copper and a barrier material, such as tungsten, from a semiconductor device structure 10 at substantially the same rates.

Slurry 30 formulations having these characteristics may be determined as known in the art, such as by measuring the open circuit potentials of copper and a barrier material, such as tungsten, in slurry 30.

Figure 6:
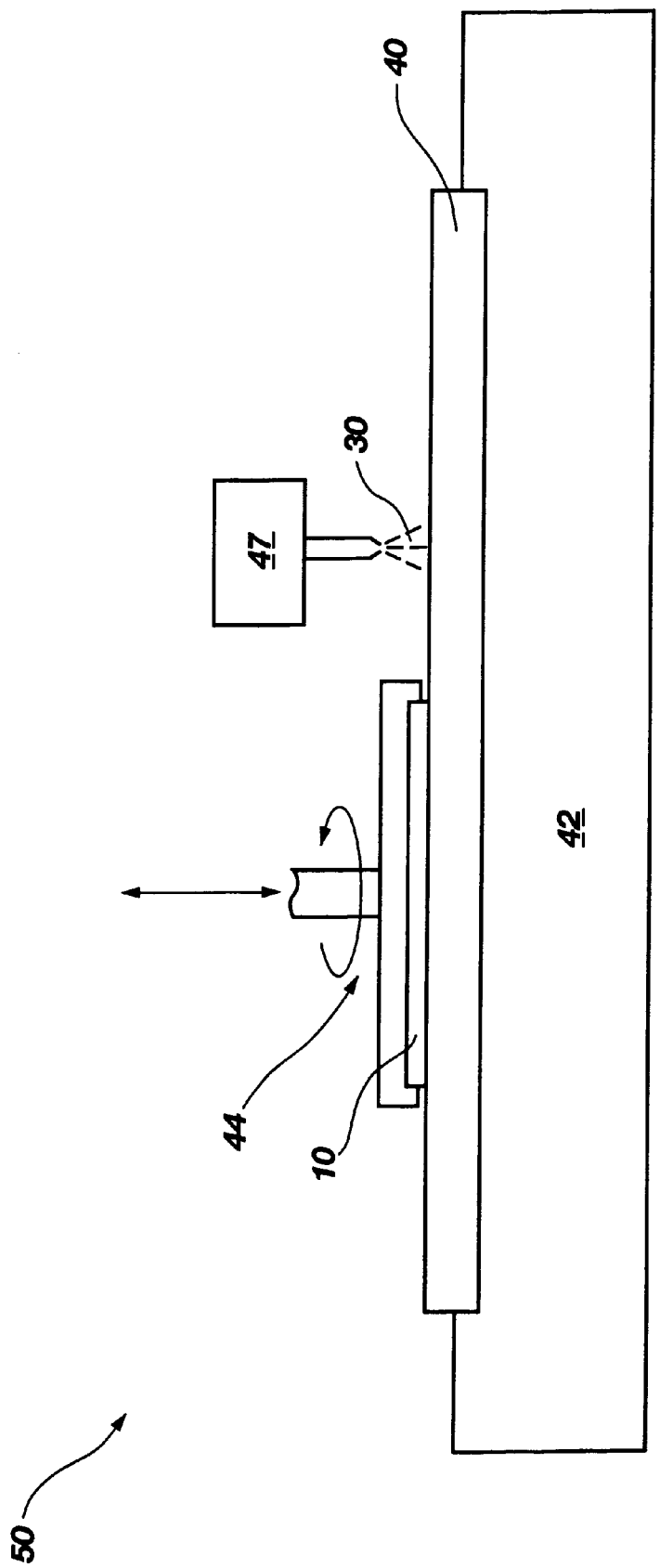
FIG. 6 is a schematic representation of an exemplary embodiment of a system that employs a fixed-abrasive polishing pad and a slurry to effect the method of the present invention.

Referring now to FIG. 6, a polishing system 50 for effecting the substantially simultaneous polishing of copper and an adjacent barrier material in accordance with the method of the present invention is illustrated. Polishing system 50 includes a polishing apparatus 42, which supports or carries a fixed-abrasive polishing pad 40, and a substrate support 44 configured to hold a semiconductor device structure 10, to bring the same into frictional contact with fixed-abrasive polishing pad 40, and, preferably, to rotate semiconductor device structure 10 relative to fixed-abrasive polishing pad 40. Polishing system 50 also includes a slurry applicator 47. Although polishing apparatus 42 is illustrated in FIG. 6 as a web-type polishing apparatus, other known types of polishing apparatus, including, without limitation, belt-type sand conventional rotational-type polishing apparatus, may alternatively be used in polishing systems incorporating teachings of the present invention.

Any known CMP apparatus, including conventional, rotary CMP apparatus, web format CMP apparatus, and belt format CMP apparatus, may comprise polishing apparatus 42, substrate support 44, and slurry applicator 47 of polishing system 50. Fixed-abrasive polishing pad 40 may similarly include any known fixed-abrasive polishing pad, such as the acrylic fixed-abrasive polishing pads available from 3M Company, in any known pad format (e.g., conventional, web, or belt).

In use of polishing system 50, one or more semiconductor device structures 10 having one or more layers thereon that are to be chemical-mechanical polished are secured to substrate support 44. If necessary, fixed-abrasive polishing pad 40 is also secured to polishing apparatus 42. Slurry 30 is introduced by slurry applicator 47 onto one or both of semiconductor device structure 10 and fixed-abrasive polishing pad 40. Once slurry 30 has been applied to fixed-abrasive polishing pad 40 one or both of semiconductor device structure 10 and fixed-abrasive polishing pad 40 are substantially continuously laterally moved (e.g., rotated or vibrated or otherwise moved side-to-side) and brought into frictional contact with one another so as to effect the CMP process. For example, when a web format or belt format polishing apparatus is employed, the apparatus may precess semiconductor device structure 10 (ie., rotate semiconductor device structure 10 around the axis of a support therefor), while the polishing pad remains substantially stationary.

One the desired portions of one or more layers 18, 20 (FIGS. 2–5) have been removed from semiconductor device structure 10, semiconductor device structure 10 is moved away from fixed-abrasive polishing pad 40. Slurry 30 remaining on semiconductor device structure 10 is rinsed or otherwise removed therefrom by known processes. Subsequent fabrication processes may then be conducted on semiconductor device structure 10, as known in the art. Polishing pad 40 may be incrementally moved to provide a fresh pad segment that was not utilized to polish semiconductor device structure 10. Polishing pad 40 may be moved a distance that is less than the distance across (e.g., diameter) a semiconductor device structure 10 to be polished therewith. Preferably, polishing pad 40 is moved a distance that is at most about 1% of the maximum distance across semiconductor device structure 10 so as to uniformly polish semiconductor device structures 10 and to maximize the useful life of polishing pad 40. As an example, following the use of a polishing pad 40 to polish one or more 8 inch wafers, polishing pad 40 may be incrementally moved about a quarter of an inch (i.e., about 0.25 inches) between polishing each wafer or set of wafers.

While polishing in accordance with the present invention may be conducted at any suitable polishing temperature, polishing with slurry 30 and a fixed-abrasive polishing pad 40 may be conducted at lower temperatures than those of conventional polishing processes. For example, polishing methods that incorporate teachings of the present invention may be conducted at temperatures of about room temperature (e.g., about 23–27° C.) or cooler. It has been found that polishing causes fewer defects when conducted at cooler temperatures. The abrasive components of conventional slurries do not, however, remain soluble in or, thus, evenly dispersed throughout such slurries at cooler temperatures.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed is:

1. A system for polishing a conductive structure of a semiconductor device, the conductive structure including a conductive region comprising copper and an adjacent barrier layer, said system comprising:
    a fixed-abrasive polishing pad; and
    a slurry to be used with said fixed-abrasive polishing pad, said slurry being substantially free of abrasives and formulated to substantially concurrently polish the conductive region and the barrier layer so as to remove a material of said barrier layer at substantially the same rate as or at a slower rate than copper is removed.

2. The system of claim 1, wherein said fixed-abrasive polishing pad includes abrasive particles comprising at least one of aluminum oxide, titanium dioxide, silicon dioxide, and cerium dioxide.

3. The system of claim 1, wherein said slurry is formulated to oxidize the copper of the conductive region of the conductive structure at substantially the same rate as or at a faster rate than said material of the barrier layer of the conductive structure is oxidized.

4. The system of claim 1, wherein said slurry is formulated to oxidize copper at substantially the same rate as or at a faster rate than tungsten is oxidized.

5. The system of claim 1, wherein, in said slurry, said material of the barrier layer of the conductive structure and copper have substantially the same oxidation energies.

6. The system of claim 5, wherein, in said slurry, said material of the barrier layer of the conductive structure has an oxidation energy of about 0.25 V more to about 0.20 V less than an oxidation energy of copper in said slurry.

7. The system of claim 1, wherein, in said slurry, tungsten has an oxidation energy of about 0.25 V more to about 0.20 V less than an oxidation energy of copper in said slurry.

8. The system of claim 1, wherein, in said slurry, a rate of removal of said material of the barrier layer is up to about ten times slower than a rate of removal of copper.

9. The system of claim 1, wherein, in said slurry, a rate of removal of said material of the barrier layer is about two to about four times slower than a rate of removal of copper.

10. The system of claim 1, wherein said slurry is formulated to remove copper and tungsten without substantially dissolving tungsten that underlies remaining portions of the copper.

11. The system of claim 1, wherein said slurry is formulated to remove copper and said material of the barrier layer without substantially dissolving said material in portions of the barrier layer that underlie remaining portions of the copper.

12. The system of claim 1, wherein said slurry comprises at least one oxidizer, at least pH control agent, and at least one inhibitor.

13. The system of claim 12, wherein said at least one oxidizer comprises at least one of an ammonium compound, a nitrate compound, and an amine compound.

14. The system of claim 12, wherein said at least one oxidizer comprises at least one of hydrogen peroxide, potassium iodate, potassium permanganate, ammonium persulfate, ammonium molybdate, ferric nitrate, nitric acid, potassium nitrate, and ammonia.

15. The system of claim 12, wherein said at least one oxidizer comprises about 0.1% to about 20% of the weight of said slurry.

16. The system of claim 12, wherein said at least one oxidizer comprises about 0.1% to about 5% of the weight of said slurry.

17. The system of claim 12, wherein said at least one pH control agent comprises at least one of potassium hydrogen phthalate, ammonium acetate, ammonium oxalate, ammonium carbamate, ammonium phosphate, ammonium hydrogen phosphate, ammonium dihydrogen phosphate, dibasic ammonium citrate, tribasic ammonium citrate, acetic acid, phosphoric acid, and sulfiric acid.

18. The system of claim 12, wherein said at least one inhibitor comprises at least one of an azole, an amine, and a ring compound.

19. The system of claim 12, wherein said at least one inhibitor comprises at least one of benzenetriazole (BTA), mercaptobenzothiazole, tolytriazole, methylamine, diethylamine, pyridine, quinoline, dicyclohexamine nitrate, potassium silicate, ammonium borate, ammonium phosphate, and potassium dichromate.

20. The system of claim 12, wherein said at least one inhibitor comprises about 0.05% to about 2% of the weight of said slurry.

21. The system of claim 12, wherein said at least one inhibitor comprises about 0.05 to about 0.2% of the weight of said slurry.

22. The system of claim 12, wherein said slurry further comprises at least one complexing agent comprising at least one of glycine, ammonium citrate, ammonium phosphate, and ammonium acetate.

23. The system of claim 22, wherein said at least one complexing agent comprises about 2% to about 15% of the weight of said slurry.

24. The system of claim 22, wherein said at least one complexing agent comprises about 3% to about 5% of the weight of said slurry.

25. The system of claim 12, wherein said slurry includes:
    about 0.1% to 20% of said at least one oxidizer, by weight of said slurry; and
    about 0.05% to about 2% of said at least one inhibitor, by weight of said slurry.

26. The system of claim 12, wherein said slurry includes:
    about 0.1% to about 5% of said at least one oxidizer, by weight of said slurry; and
    about 0.05% to about 0.2% of said at least one inhibitor, by weight of said slurry.

27. The system of claim 1, wherein said slurry has a pH of about 2 to about 6.

28. The system of claim 1, wherein said slurry has a pH of about 3 to about 5.

29. The system of claim 1, wherein said fixed-abrasive polishing pad comprises one of a round polishing pad, a belt format polishing pad, and a web format polishing pad.

30. The system of claim 1, wherein said fixed-abrasive polishing pad is configured to be moved incrementally following use thereof to polish a semiconductor device structure.

31. The system of claim 30, wherein said fixed-abrasive polishing pad is configured to be laterally moved in increments that are equal to about 1% or less of a distance across a semiconductor device structure to be polished therewith.

32. The system of claim 1, wherein said slurry removes copper at a temperature of about 27° C. or cooler.

33. A slurry for use in chemical-mechanical polishing processes, comprising at least one oxidizer, at least one pH control agent, and at least one inhibitor, said slurry being formulated with relative amounts of said at least one oxidizer, said at least one pH control agent, and said at least one inhibitor balanced so as to facilitate substantially concurrent polishing of a first structure comprising copper and a second structure comprising tungsten with said tungsten being removed at substantially the same rate as or at a slower rate than said copper is removed.

34. The slurry of claim 33, being substantially free of abrasives.

35. The slurry of claim 33, wherein said relative amounts are balanced so that said tungsten is oxidized at substantially the same rate as or at a slower rate than said copper is oxidized.

36. The slurry of claim 33, wherein said relative amounts are balanced so that an oxidation energy of tungsten in said slurry is substantially the same as an oxidation energy of copper in said slurry.

37. The slurry of claim 36, wherein said relative amounts are balanced so that an oxidization energy of tungsten in said slurry is about 0.25 V more to about 0.20 V less than an oxidization energy of copper in said slurry.

38. The slurry of claim 36, wherein said relative amounts are balanced so that a rate of removal of tungsten by said slurry is up to about ten times slower than a rate of removal of copper by said slurry.

39. The slurry of claim 36, wherein said relative amounts are balanced so that a rate of removal of tungsten by said slurry is about two to about four times less than a rate of removal of copper by said slurry.

40. The slurry of claim 33, wherein said relative amounts are balanced so that said second structure is not dissolved at a substantially greater rate than said first structure is dissolved.

41. The slurry of claim 33, wherein said at least one pH control agent comprises at least one of potassium hydrogen phthalate, ammonium acetate, ammonium oxalate, ammonium carbamate, ammonium phosphate, ammonium hydrogen phosphate, ammonium dihydrogen phosphate, dibasic ammonium citrate, tribasic ammonium citrate, acetic acid, phosphoric acid, and sulfuric acid.

42. The slurry of claim 33, having a pH of about 2 to about 6.

43. The slurry of claim 33, having a pH of about 3 to about 5.

44. The slurry of claim 33, wherein said at least one oxidizer comprises at least one of an ammonium compound, a nitrate compound, and an amine compound.

45. The slurry of claim 33, wherein said at least one oxidizer comprises at least one of hydrogen peroxide, potassium iodate, potassium permanganate, ammonium persulfate, ammonium molybdate, ferric nitrate, nitric acid, potassium nitrate, ammonia, and other amine compounds.

46. The slurry of claim 33, wherein said at least one inhibitor comprises at least one of an azole, an amine, and a ring compound.

47. The slurry of claim 33, wherein said at least one inhibitor comprises at least one of benzenetriazole (BTA), mercaptobenzothiazole, tolytriazole, methylamine, diethylamine, pyridine, quinoline, dicyclohexamine nitrate, potassium silicate, ammonium borate, ammonium phosphate, and potassium dichromate.

48. The slurry of claim 33, comprising about 0.1% to about 20% of said at least one oxidizer, by weight of said slurry.

49. The slurry of claim 48, comprising about 0.1% to about 5% of said at least one oxidizer, by weight of said slurry.

50. The slurry of claim 33, comprising about 0.05% to about 2% of said at least one inhibitor, by weight of said slurry.

51. The slurry of claim 50, comprising about 0.05% to about 2% of said at least one inhibitor, by weight of said slurry.

52. The slurry of claim 33, further comprising at least one complexing agent.

53. The slurry of claim 52, wherein said at least one complexing agent comprises at least one of glycine, ammonium citrate, ammonium phosphate, and ammonium acetate.

54. The slurry of claim 52, comprising about 1% to about 15% of said at least one complexing agent, by weight of said slurry.

55. The slurry of claim 54, comprising about 3% to about 5% of said at least one complexing agent, by weight of said slurry.

56. The slurry of claim 33, further comprising at least one surfactant.

57. The slurry of claim 56, wherein said at least one surfactant comprises at least one of polyethylene glycol, polyoxyethylene ether, glycerol, polypropylene glycol, polyoxyethylene lauryl ether, polyoxyethylene cetyl ether, polyoxyethylene stearyl ether, and polyoxyethylene oleyl ether.

58. The slurry of claim 56, comprising about 1% to about 15% of said a least one surfactant, by weight of said slurry.

59. The slurry of claim 56, comprising about 1% to about 2% of said at least one surfactant, by weight of said slurry.

60. The slurry of claim 33, comprising a viscosity of about 10 to about 20 cps. at ambient temperature.

61. The slurry of claim 33, further comprising a thickener.

62. A method for formulating a slurry to be used with a fixed-abrasive polishing pad, comprising:

selecting at least one oxidizer, at least one pH control agent, and at least one inhibitor; and determining concentrations of said at least one oxidizer, said at least one pH control agent, and said at least one inhibitor that form a slurry in which oxidation energies of copper and tungsten will be substantially the same.

63. The method of claim 62, wherein said determining said concentrations comprises determining concentrations of said at least one oxidizer, said at least one pH control agent, and said at least one inhibitor at which an oxidation energy of tungsten is about 0.25 V more to about 0.20 V less than an oxidation energy of copper.

64. The method of claim 62, wherein said determining said concentrations comprises determining concentrations of said at least one oxidizer, said at least one pH control agent, and said at least one inhibitor at which a rate of removal of tungsten is up to about ten times slower than a rate of removal of copper.

65. The method of claim 62, wherein said determining concentrations comprises determining concentrations of said at least one oxidizer, said at least one pH control agent, and said at least one inhibitor at which a rate of removal of tungsten is about two to about four times slower than a rate of removal of copper.

66. The method of claim 62, wherein said selecting said at least one oxider, said at least one pH control agent, and said at least one inhibitor is at least partially related to a type of abrasive of the fixed-abrasive polishing pad.

67. The method of claim 62, wherein said determining said concentrations comprises determining a concentration of said at least one oxidizer within a range of about 0.1% to about 20% of the weight of said slurry.

68. The method of claim 62, wherein said determining said concentrations comprises determining a concentration of said at least one oxidizer within a range of about 0.1% to about 5% of the weight of said slurry.

69. The method of claim 62, wherein said determining said concentrations comprises determining a concentration of said at least one inhibitor to be within a range of about 0.05% to about 2% of the weight of said slurry.

70. The method of claim 62, wherein said determining said concentrations comprises determining a concentration of said at least one inhibitor within a range of about 0.05% to about 0.2% of the weight of said slurry.

71. The method of claim 62, wherein said determining said concentrations comprises:

determining a concentration of said at least one oxidizer within a range of about 0.1% to about 20% of the weight of said slurry; and determining a concentration of said at least one inhibitor within a range of about 0.05% to about 2% of the weight of said slurry.

72. The method of claim 71, wherein said determining said concentration of said at least one oxidizer comprises determining said concentration within a range of about 0.1% to about 5% of the weight of said slurry.

73. The method of claim 71, wherein said determining said concentration of said at least one inhibitor comprises determining said concentration of said at least one inhibitor within a range of about 0.05% to about 0.2% of the weight of said slurry.

74. The method of claim 62, wherein said determining said concentrations comprises determining at least one set of concentrations at which the slurry will oxidize copper at substantially the same rate as or at a faster rate than tungsten is oxidized.

75. A method for formulating a slurry to be used with a fixed-abrasive polishing pad, comprising:

selecting at least one oxidizer, at least one pH control agent, and at least one inhibitor; and determining concentrations of said at least one oxidizer, said at least one pH control agent, and said at least one inhibitor that form a slurry which is substantially free of abrasives and in which copper will oxidize at substantially the same rate as or at a faster rate than tungsten is oxidized.

76. A method for formulating a slurry to be used with a fixed-abrasive polishing pad, comprising:

selecting at least one oxidizer, at least one pH control agent, and at least one inhibitor; and determining concentrations of said at least one oxidizer, said at least one pH control agent, and said at least one inhibitor that form a slurry in which tungsten will be removed at substantially the same rate or a slower rate than copper will be removed.

\* \* \* \* \*

UNITED STATES PATENT AND TRADEMARK OFFICE
CERTIFICATE OF CORRECTION

PATENT NO.         : 6,602,117 B1                                              Page 1 of 2
APPLICATION NO. : 09/651808
DATED              : August 5, 2003
INVENTOR(S)        : Dinesh Chorpa and Nishant Sinha It is certified that error appears in the above-identified patent and that said Letters Patent is
hereby corrected as shown below:

On the title page:
In item (56) References Cited,
Other Publications, LINE 12,           Change "electrochmical" to -- Electrochemical --

Figure 1:
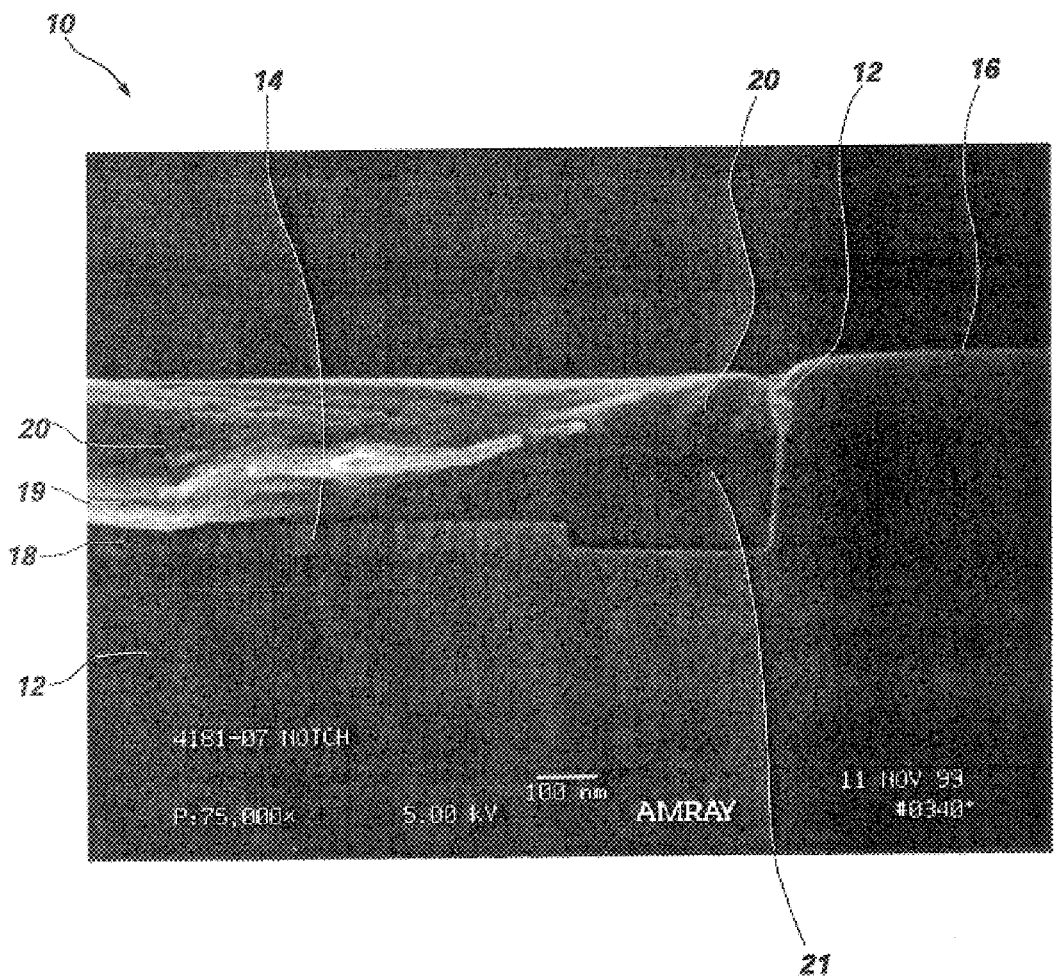
FIG. 1 is an electron micrograph illustrating the dissolution of regions of a tungsten barrier layer that underlie a copper structure of a semiconductor device structure when a conventional slurry is used to simultaneously remove the copper and tungsten.

In the drawings:
        In FIG. 1,            change the top right-hand occurrence of reference
numeral "12" to --22--, replace the FIG 1 with the
following corrected figure:

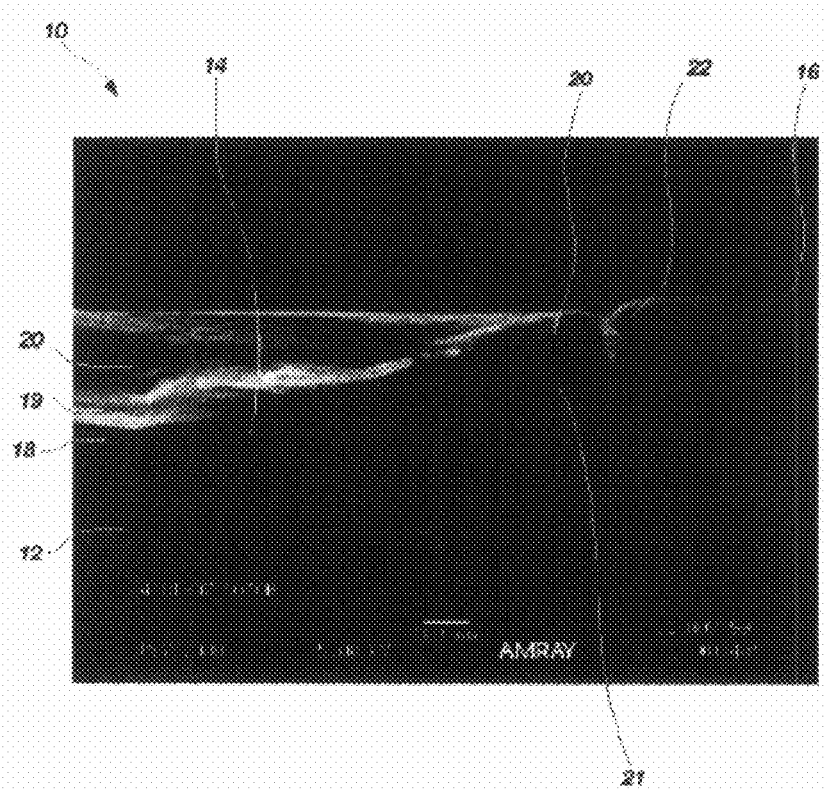

Fig. 1

UNITED STATES PATENT AND TRADEMARK OFFICE
CERTIFICATE OF CORRECTION

PATENT NO. : 6,602,117 B1
APPLICATION NO. : 09/651808
DATED : August 5, 2003
INVENTOR(S) : Dinesh Chorpa and Nishant Sinha It is certified that error appears in the above-identified patent and that said Letters Patent is hereby corrected as shown below:

In the specification:
COLUMN 1,   LINE 50,   change "substrates" to -- substrate, --
COLUMN 5,   LINE 37,   delete comma after "energies"
COLUMN 5,   LINE 44,   insert a comma after "invention"
COLUMN 7,   LINE 5,    delete semicolon after "acid"
COLUMN 8,   LINE 1,    change "sand" to -- and --

In the claims:
CLAIM 58,  COLUMN 12,  LINE 30,  change "said a least" to --said at least--

Signed and Sealed this

Seventeenth Day of October, 2006

JON W. DUDAS
*Director of the United States Patent and Trademark Office*